United States Patent [19]
Johnson

[11] Patent Number: 6,064,683
[45] Date of Patent: May 16, 2000

[54] BANDGAP ISOLATED LIGHT EMITTER

[75] Inventor: Ralph H. Johnson, Murphy, Tex.

[73] Assignee: Honeywell Inc., Minneapolis, Minn.

[21] Appl. No.: 08/989,734

[22] Filed: Dec. 12, 1997

[51] Int. Cl.[7] .................................................. H01S 3/19
[52] U.S. Cl. .............................. 372/46; 372/43; 372/45; 372/47; 372/44; 372/50
[58] Field of Search ................................. 372/43, 44, 45, 372/46, 47, 50

[56] References Cited

U.S. PATENT DOCUMENTS

| | | | |
|---|---|---|---|
| 4,980,893 | 12/1990 | Thornton et al. | 372/50 |
| 5,056,098 | 10/1991 | Anthony et al. | 372/45 |
| 5,115,442 | 5/1992 | Lee et al. | 372/45 |
| 5,164,949 | 11/1992 | Ackley et al. | 372/45 |
| 5,475,701 | 12/1995 | Hibbs-Brenner | 372/50 |
| 5,574,738 | 11/1996 | Morgan | 372/28 |
| 5,608,753 | 3/1997 | Paoli et al. | 372/50 |
| 5,699,375 | 12/1997 | Paoli et al. | 372/50 |
| 5,751,752 | 5/1998 | Shakuda | 372/45 |
| 5,764,674 | 6/1998 | Hibbs-Brenner et al. | 372/46 |
| 5,774,487 | 6/1998 | Morgan | 372/45 |
| 5,893,722 | 4/1999 | Hibbs-Brenner et al. | 372/46 X |
| 5,912,913 | 6/1999 | Kondow et al. | 372/45 |

OTHER PUBLICATIONS

FR 2 440 616 A (Bouley Jean Claude) May 30, 1980, see p. 3, col. 22—p. 5, col. 20; figures 3, 4.

Patent Abstracts of Japan, vol. 010, No. 240 (E–429), Aug. 19, 1986 –& JP 61 070784 A (Mitsubishi Electric Corp), Apr. 11, 1986, see abstract.

Patent Abstracts of Japan, vol. 014, No. 338 (E–0954), Jul. 20, 1990 –& JP 02 114676A 9Sumitomo Electric Ind Ltd), Apr. 26, 1990, see abstract.

Patent Abstracts of Japan, vol. 014, No. 338(E–0954), Jul. 20, 1990 & JP 02 114675 A (Sumitomo Electric Ind Std), Apr. 26, 1990, see abstract.

Patent Abstracts of Japan, vol. 009, No. 318 (E–366), Dec. 13, 1985 –& JP 60 152087 A (Nippon Dneki KK), Aug. 10, 1985, see abstract.

Patent Abstracts of Japan, mol. 011, No. 288 (E–542), Sep. 17, 1987 –& JP 62 086883 A (Matsushita Electric Ind Co Ltd), Apr. 21, 1987, see abstract.

Patent Abstracts of Japan, vol. 017, No. 356 (E–1394), Jul. 6, 1993 –& JP 05 0555702 A (Mitsubishi Electric Corp), Mar. 5, 1993, see abstract.

EP 0 562 768 A (American Telephone & Telegraph) Sep. 29, 1993, see col. 5, line 1—col. 5, line 31; figure 2.

English abstract of FR 2440616 from http://www.dialogweb.com Apr. 5, 1999.

Jewell et al "Surface–emitting microlasers for photonic switching and interchip connections", *Optical Engineering*, Mar. 1990, vol. 29, No. 3, pp. 210–214.

Chemla et al, "Nonlinear opitical properties of semiconductor quantum wells", *Optical Nonlinearities and Instabilities in Semiconductors*, (Academic Press 1988), pp. 83–120.

Lee et al, "Top–surface–emitting GaAs four–quantum–well lasers emitting at 0·85 $\mu$m", *Electronics Letters*, May 24, 1990, vol. 26, No. 11, pp. 710–711.

*Primary Examiner*—Brian Healy
*Attorney, Agent, or Firm*—John G. Shudy Jr.; Roland W. Norris; Kris T. Frederick

[57] ABSTRACT

A light emitting device having a first mirror, an active layer, a second mirror, and a beryllium implantation resulting in a peripheral boundary of a waveguide through the first and second mirrors, the active layer and the trapping layer. A P-N junction is situated within the implantation and the guide. The turn on voltage is lower for the junction within the waveguide than that within the implantation, resulting in confinement of current within the guide at a voltage applied to the device that is greater than the lower junction voltage and less than the higher junction voltage. The device also has an electron trapping layer between said first mirror and said active layer, and a conduction layer situated on said second mirror.

33 Claims, 8 Drawing Sheets

BANDGAP ISOLATED LIGHT EMITTER

BACKGROUND

This invention relates to the field of semiconductor light emitting devices, and particularly relates to current confinement within lasers.

The typical semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

Several types of surface emitting lasers have been developed. One such laser of special promise is termed a "vertical cavity surface emitting laser" (VCSEL). (See, for example, "Surface-emitting microlasers for photonic switching and inter-chip connections," Optical Engineering, 29, pp. 210–214, March 1990, for a description of this laser. For other examples, note U.S. Pat. No. 5,115,442, by Yong H. Lee et al., issued May 19, 1992, and entitled "Top-emitting surface emitting laser structures," which is hereby incorporated by reference, and U.S. Pat. No. 5,475,701, issued Dec. 12, 1995, by Mary K. Hibbs-Brenner, and entitled "Integrated laser power monitor," which is hereby incorporated by reference. Also, see "Top-surface-emitting GaAs four-quantum-well lasers emitting at 0.85 $\mu$m," Electronics Letters, 26, pp. 710–711, May 24, 1990.) The laser described has an active region with bulk or one or more quantum well layers. The quantum well layers are interleaved with barrier layers. On opposite sides of the active region are mirror stacks which are formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is turned on and off by varying the current through the active region. However, a technique for digitally turning the laser on and off, varying the intensity of the emitted radiation from a vertical cavity surface emitting laser by voltage, with fixed injected current, is desirable. Such control is available with a three terminal voltage-controlled VCSEL described in U.S. Pat. No. 5,056,098, by Philip J. Anthony et al., and issued Oct. 8, 1991, which is hereby incorporated by reference.

For several reasons, it is desirable to use surface emitting devices. For example, surface emitting devices can be fabricated in arrays with relative ease while edge emitting devices can not be as easily fabricated into arrays. An array of lasers can be fabricated by growing the desired layers on a substrate and then patterning the layers to form the array. Individual lasers may be separately connected with appropriate contacts. Such arrays are potentially useful in such diverse applications as, for example, image processing inter-chip communications, i.e., optical interconnects, and so forth. Second, typical edge-emitter lasers are turned on and off by varying the current flow through the device. This requires a relatively large change in the current through the device which is undesirable; the surface emitting laser, described below, requires lower drive current, and thus the change of current to switch the VCSEL need not be as large.

Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields.

In FIG. 1 is a diagram of a two terminal VCSEL 10. Formed on an n+ gallium arsenide (GaAs) substrate 14 is an n-contact 12. As indicated, substrate 14 is doped with impurities of a first type (i.e., n type). An n– mirror stack 16 is formed on substrate 14. Formed on stack 16 is a layers 18. Layers 18 has a bottom n-confinement or spacer layer 20 formed on stack 16, an active region 22 formed on layer 20 and a top n-confinement or spacer layer 24 formed on active region 22. A p– mirror stack 26 is formed on top confinement layer 24. As noted, sometimes confinement layers 20 and 24 may be referred to as spacers with active region 22 in between them. A p– metal layer 28 is formed on stack 26. The emission region may have a passivation layer 30. Isolation region 29 restricts the area of the current flow 27 through the active region. Region 29 can be formed by deep H+ ion implantation or by other known techniques.

Layers 18 may contain quantum wells disposed between mirror stacks 16 and 26. Stacks 16 and 26 are distributed Bragg reflector stacks. Quantum well active region 22 has alternating layers of aluminum gallium arsenide (AlGaAs) barrier layers and GaAs well layers. Stacks 16 and 26 have periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (i.e., p type).

Contact layers 12 and 28 are ohmic contacts that allow appropriate electrical biasing of laser diode 10. When the p-n junction of the laser is forward biased with a more positive voltage on contact 28 than on contact 12, current flows from contact 28 on through the stacks to contact 12, and active region 22 emits light 32 which passes through stack 26.

There may be a saturable absorber, such as layer 25, composed of GaAs, for example, to absorb light at wavelengths ($\lambda$) less than 870 nm or composed of $In_xGa_{1-x}As$ quantum wells (such as 80 angstroms in thickness and wherein x may be 0.2 as an example) to absorb light at wavelengths less than one micron. Layer 25 can be of a $\lambda/4$ order in thickness but need not be such. Layer 25 can be situated anywhere in the stack of device 10. Instead, for instance, layer 31 may be the saturable absorber. Placement of the saturable absorber at a position in the cavity within layers 16 through 26 is influenced by the confinement factor. The saturable absorber may also be placed within spacer regions 20 or 24. For example, saturable absorber layer 25 may be a kth distance of k one-quarter wavelengths from active region 22.

A three terminal version of a vertical cavity surface emitting laser is shown in a sectional view in FIG. 2, in contrast to the two terminal VCSEL of FIG. 1. The frequency of the self pulsations of VCSEL 60 light 70 may be modulated or tuned with a drive power of varying amplitude between terminals 52 and 50. A saturable absorber may be situated anywhere between terminals 50 and 52. This inexpensive, low power device 60 has a significant frequency modulation bandwidth. The application of current across terminals 48 and 50 of VCSEL 60 can be constant, but tuned to give the right center self-pulsation frequency and/or light output. This configuration would result in minimal amplitude modulation of the VCSEL 60 light 70, as opposed to a two-terminal current-injected frequency-modulated VCSEL. Typically, the three terminal device 60 has a fixed constant current between terminals 48 and 50 resulting in a particular voltage-current (VI) (reverse or forward biased) being applied between those terminals.

As will be appreciated by those skilled in the art, some elements which are not essential to an understanding of the invention are either not depicted or described in detail. For example, only a single laser is illustrated in FIG. 2, although it will be readily noted that an array of lasers typically may be present. Shown are substrate 34, regions 36 and 46 having a first conductivity type, active region 38, regions 40 and 42 having a second conductivity type, with saturable absorption region 44 having either or neither conductivity type depending on design and operating conditions. Generally, the first conductivity is n type and the second is p type. Region 44 may comprise any number of bulk materials or one or more quantum wells, being normally absorbing at the lasing wavelength. Regions 36, 40, 42 and 46 comprise mirrors which are depicted as interference mirrors. Region 36 comprises a first mirror. Only several layers are shown for reasons of clarity. Appropriate regions of different conductivity types will be readily selected by those skilled in the art. Regions 40, 42, 44 and 46 form a second distributed mirror with a cavity Q and hence an oscillation frequency controllable via power applied to the saturable absorber through contacts 50 and 52. The active region typically comprises one or more quantum well regions which are interleaved with barrier layers, i.e., layers having a bandgap greater than the bandgap of the quantum well region. However, the use of bulk semiconductors instead is not precluded. There are first, second, and third electrical contacts 48, 50 and 52, to region 36, region 40 and layer 46, respectively. Contact 48 may be physically made to substrate 34 if the substrate is conducting and not semi-insulating. Isolation region, mode control or current confinement 54 restricts the area of the current flow through the active region to the area generally under region 46. Isolation region 54 can be formed by, e.g., deep ion implantation. Other forms of current and optical confinement may be utilized. The portions of regions 36 and 40 having first and second conductivity types, form means for injecting carriers into the active region. The first and second interference mirrors further comprise a plurality of interleaved first and second semiconductor layers with each layer having characteristics such that it is typically a quarter wavelength thick at the medium wavelength of interest thereby forming the respective interference mirror. The individual layers of the active region and the interference mirrors are not described with particularity as those skilled in the art know the structure of these elements.

Substrate 34 is conducting or semi-insulating GaAs, and regions 36, 40, 42 and 46 comprise alternating layers of AlAs and AlGaAs, as an example, with properties as described in the previous paragraph. The active region may comprise one or multiple GaAs (or, e.g., $In_xGa_{1-x}As$) quantum wells interleaved with AlGaAs barrier layers. Saturable absorption (SA) region 44 is optically coupled to region 40, i.e., the absorption due to the SA is within the distributed mirror incorporating regions 40, 42, 44 and 46. Region 46 comprises interference mirror layers of, e.g., AlAs and AlGaAs, and has a first conductivity type. Those skilled in the art will readily select appropriate layer thicknesses and these parameters need not be described in detail. The use of other semiconductors is contemplated and appropriate choices will readily be made by those skilled in the art. For instance, other Group III–IV semiconductors may be used.

Conventional and well-known epitaxial growth techniques, such as molecular beam epitaxy or metallo-organic chemical vapor deposition, may be used to grow the layers described. After the layers have been grown, conventional patterning techniques are then used to form the individual lasers in the array. Electrical contacts to the individual lasers are also fabricated. Those skilled in the art will readily select appropriate patterning and contacting techniques.

The frequency of oscillation of the self-pulsing light emitted from the device can be varied by controlling the properties of the SA region within the VCSEL structure. An embodiment may use current or voltage alteration of bulk or quantum-well material such as the quantum-confined Stark effect in quantum wells. This effect is well known and understood by those skilled in the art; the effect is described in Chapter 4 entitled "Nonlinear optical properties of semiconductor quantum wells," by D. S. Chemla et al., in *Optical Nonlinearities and Instabilities in Semiconductors*, pp. 339–347, (Academic Press 1988). Basically, the absorption depends on the magnitude of the electric field in the quantum well.

A vertical cavity surface emitting laser needs relatively large reflectivities in both mirror stacks for lasing; typically, mirror stack reflectivities should be 99 percent or greater. The SA region functions as a bias-dependent absorber, by appropriately varying the bias, the laser pulsation can be frequency modulated at different rates. A small voltage or current change may be used to vary the absorption or carrier density of the SA and hence the frequency of the VCSEL self-pulsation. However, the magnitude of the current supplied through contacts 48 and 50 of device 60 of FIG. 2, may remain essentially constant as the laser is modulated. This simplifies the design of the power supply (not shown) for the array and minimizes any problems that might otherwise arise due to the varying heat generated in the vertical cavity laser array, due to the varying carrier density in the active region, and due to the resulting index changes in the optical cavity.

In FIG. 2, terminal 50 represents the top (usually the p type) contact and terminal 48 represents the bottom contact (usually the n type) contact. The bottom contact may be a common metalization on the bottom like contact 12 as shown in FIG. 1. Contact 52 represents a third connection which can be used to either reverse bias or forward bias the saturable absorber layer which is schematically illustrated by layer 44.

Light of the device may be emitted through either the substrate at one end or the top mirror at the other end. It will also be understood that the term, "vertical," is used to mean perpendicular to the major surfaces of the substrate. The means for injecting power can have first and second conductivity types on opposite sides of the active region, either along the axis formed by the first mirror, active region and second mirror, or along some other axis.

SUMMARY OF THE INVENTION

The present embodiment of a light emitting device has a first mirror, an active layer, a second mirror, a trapping layer, and a beryllium implantation or diffusion having an annular or peripheral boundary, through the second mirror, the active layer, and into the trapping layer. The P-N junction in the periphery of the device is shifted into the wide energy bandgap material by the diffusion. The turn-on voltage is lower for the junction within the center of the laser than that within the diffusion, resulting in confinement of current within the center at a voltage applied to the device, that is greater than the lower junction voltage at the center of the laser and less than the higher junction voltage at the edge of the diffusion at the periphery of the laser. The wide bandgap material may be an electron trapping layer between said first mirror and said active layer. Also, a conduction layer may be situated on said second mirror.

DESCRIPTION OF THE EMBODIMENTS

Figure 1:
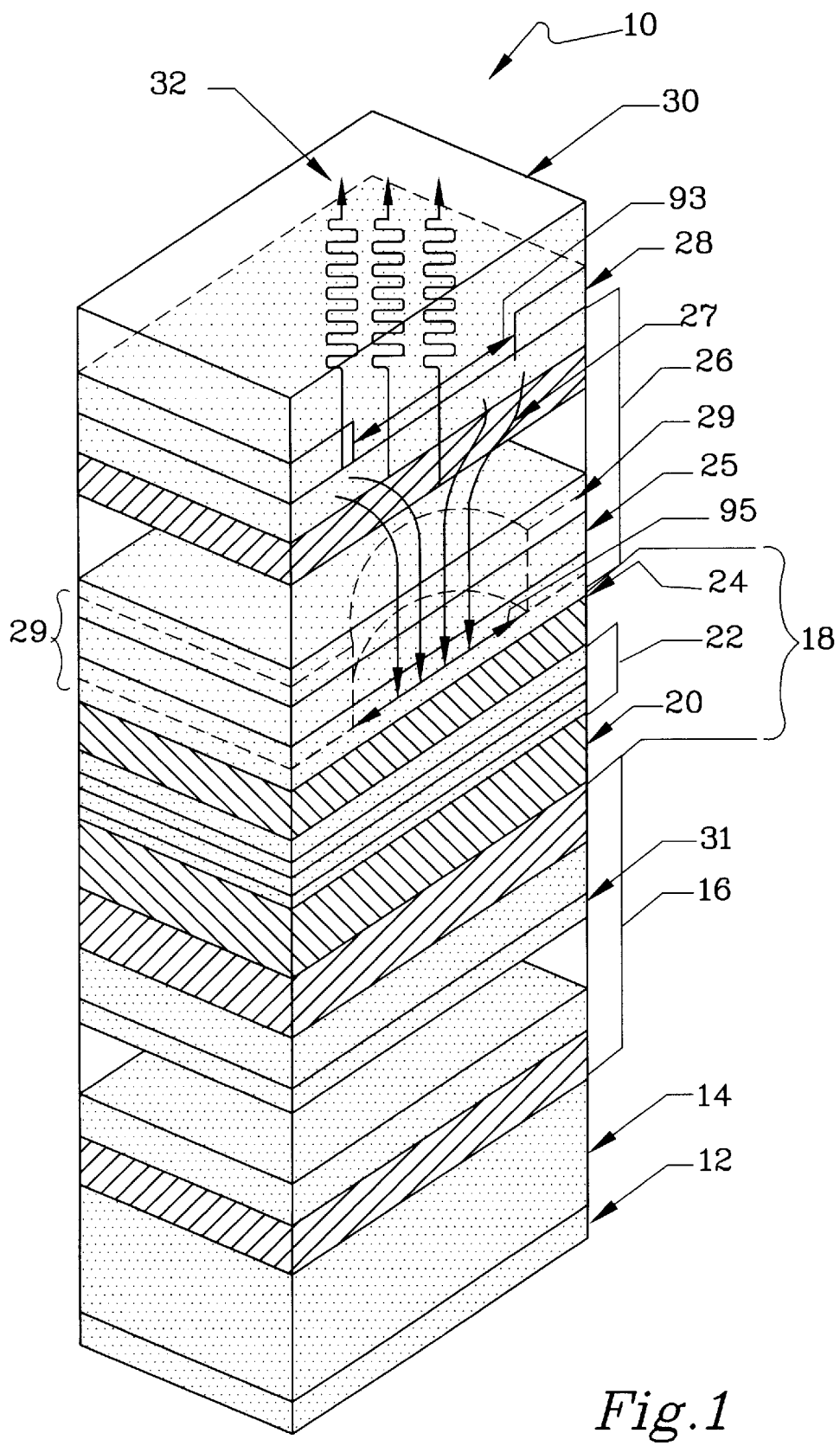
FIG. 1 is an illustration of a planar, current-guided, GaAs/AlGaAs top surface emitting vertical cavity laser.
Figure 2:
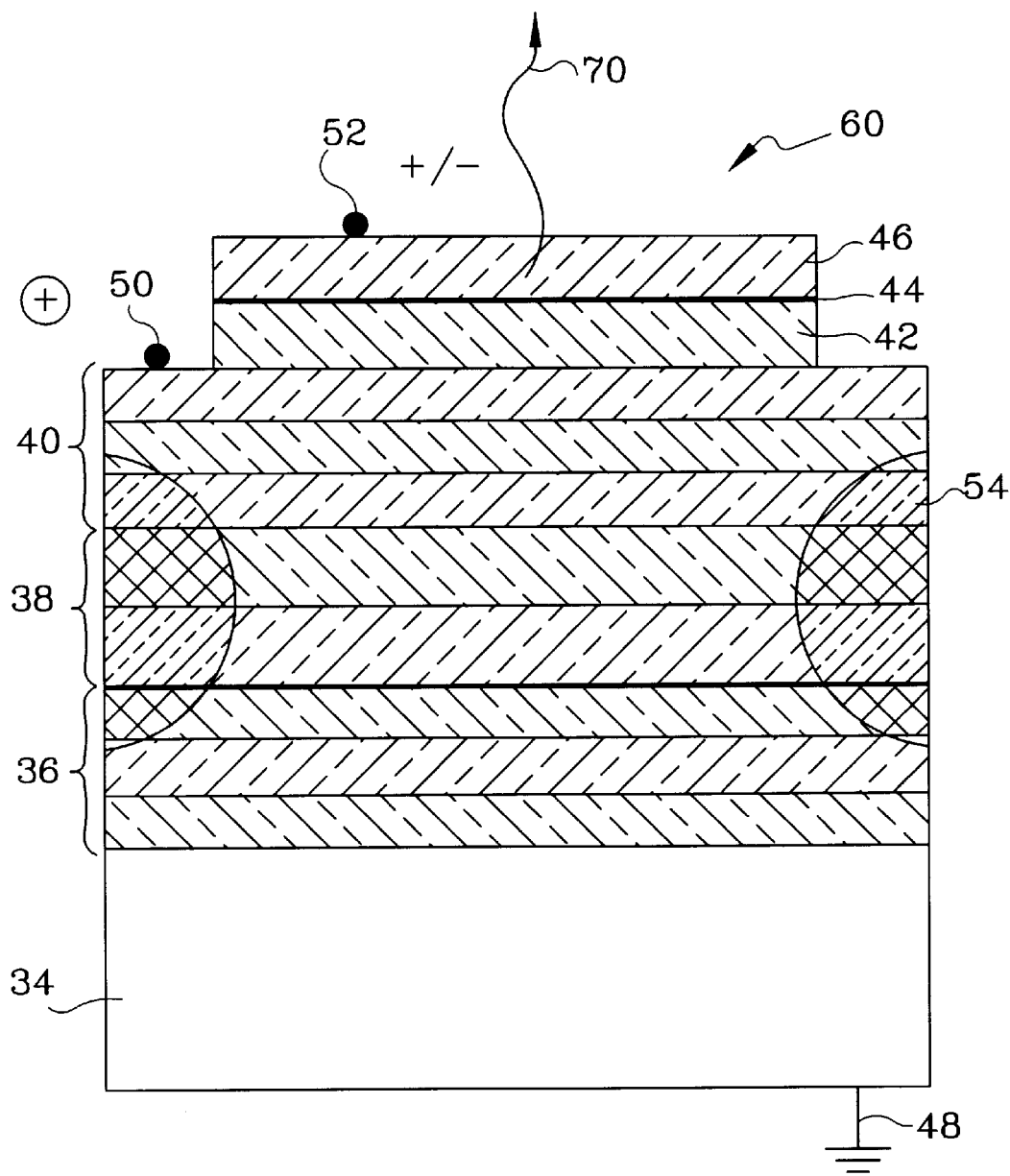
FIG. 2 is a cross-section of a three terminal frequency modulated VCSEL.
Figure 3:
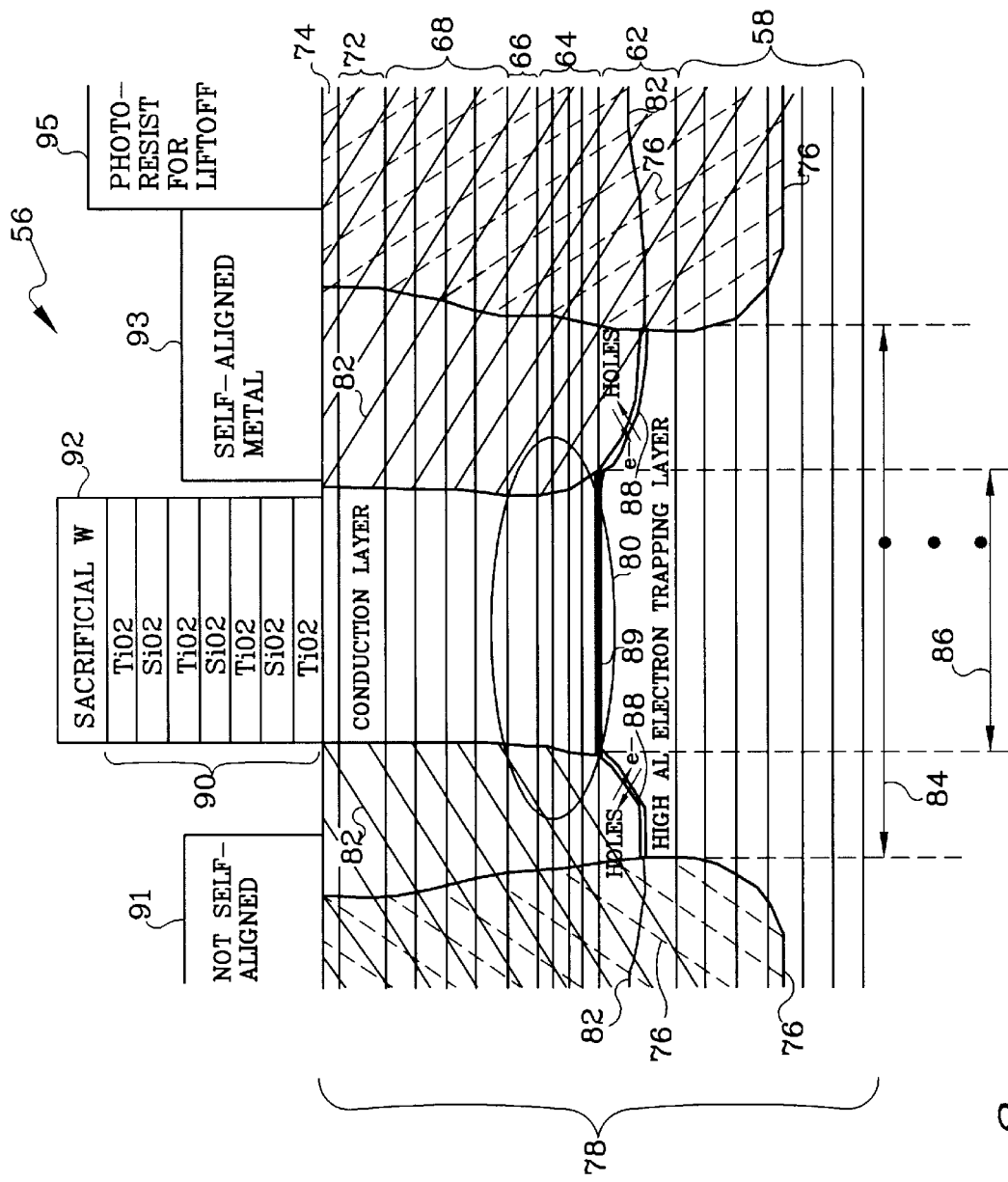
FIGS. 3, 4 and 5 are embodiments of the invention.

A light emitting structure 56 involving the present invention is shown in FIG. 3. Layers 58 form a lower n type semiconductor mirror. Formed on the lower semiconductor mirror is a high Al electron trapping layer 62. Formed on trapping layer 62 are n or p type, typically p type, active layers 64 and 66. Formed on upper spacer is p type upper semiconductor mirror 68. Carbon and Silicon may be used as dopant types p and n, respectively, in the GaAs based structure. A conduction layer 72 is formed on upper semiconductor mirror 68. Formed on conduction layer 72 is a cap 74. Conduction layer 72 spreads out the current and provides a low resistance. A proton implant 76 is formed in wafer 78. Implant 76 provides a resistivity profile which is created by ion bombardment-induced crystalline damage which is because of the ion implantation 76. This ion implantation isolates the devices and reduces capacitance. Ion implantation 76 is chosen so as the result in semi-insulating material from the surface, at least through the active region. Biasing current is introduced to the top electrode and passes through the active gain region. only resistance increase is realized by ion bombardment 76. Implant 76 results in a common portion which is generally circular in cross section having an inside diameter 84 and physically defined primarily in terms of damage, which is restricted to the regions outside of the columnar portion by the resist region use. There is an active gain region 80 situated mainly in the active layer 64.

Another diffusion or implant 82 is imposed on wafer 78. The ions are those of beryllium (Be). Implant 82 forms a column or portion 86 that is circular having an inside diameter 86. In contrast, implant 76 forms an insulating region outside of dimension 84 which reduces parasitic capacitance and isolates the device from others. Implant 76 has no current confining purposes. Implant 82 pushes the p-n junction down the structure into region 62 at places 88, by turning n type doped material into p type doped material. This p-n junction is pushed into wider energy gap material with the Be p type doping from the implanted region. The active region has a p-n junction in narrow bandgap material resulting in the turn-on voltage of the periphery material to be higher than the turn-on voltage at the center of the laser. Under normal operation, very little current, if any, flows at the wide gap p-n junction. The most and only significant current flow is in the narrow gap active region because of the lower turn-on junction voltage due to the p-n junction being in the narrow gap material at or near the quantum wells, if any.

At the top of wafer 78 above the optical waveguide of dimension 86 is formed a dielectric stack mirror 90. Mirror 90 has alternating layers of $TiO_2$ and $SiO_2$. On top of the dielectric stack mirror is sacrificial tungsten 92 formed on surface of wafer 78 is not self-aligned metal 91 on the left and self-aligned metal 93 on the right hand side of stack 90 in FIG. 3. Also formed on wafer 78 is photoresist material 95 for liftoff.

Instead of using a proton implant to isolate the structure, an etch can be used to isolate it. Etch 97 is merely a straight-down etch down into the lower mirror 58 of FIG. 4. If this etch is used, then an additional lateral inter-oxidation 98 or 99 can be used, as shown in FIG. 5. The lateral etch or oxidation creates a lensing effect on the light. Lateral etch/oxidation 98 is imposed on the lower part of upper spacer 66 and oxidation 99 is imposed in a top layer of mirror 58.

The optimum device should not have parasitic edge currents, it should be index guided, it should have high contrast mirrors, and it should be self aligned to be manufacturable. The optimum device in every implementation, such as in FIG. 3, places a high threshold voltage or wide bandgap semiconductor junction 88 away from active region 80 or junction 89. This increases the forward voltage of junction 88 and results in a current confinement to lower turn on voltage within active region 80 at junction 89 in the narrow bandgap semiconductor material. Present device 56 uses a Be implant 82 (or other p-type implant) to create a waveguide having dimension 86 for determining the modes. If the doping level is too low, then the guide will not be created by Be implant 82. Both optical waveguide 86 and the electrical current confinement 86 are self-aligned with a dielectric stack mirror/waveguide 90 on top of device 56. The position of p-n junction 88 is in the wide gap material or high aluminum content electron trapping layer 62 whose composition creates a minority carrier trapping structure. Layer 62 also functions as a spacer, which along with spacer 66 which provides for a proper resonant cavity length 100 between mirrors 58 and 68. The beginning (bottom) and ending (top) layers of the dielectric stack mirror 90 have the higher index (e.g., $TiO_2$ rather than $SiO_2$) materials of the layers in stack 90. This results from the need to minimize absorption in cap layer 74. Conduction layer 72 has an optional stratified doping scheme so that the peaks of the electric field come where there is relatively low doping, and the minima of the electric field come at maximum doping. A minimum of the electric field is also at cap layer 74. Metal contact 91 or 93 may or may not be self aligned.

Structure 56 has self aligned metal 93 and a proton implant 76 for isolation. Metal 91 is not self aligned. Proton implant 76 is not the only way to isolate structure 56. Lower spacer layer 62 provides for a sufficient Be implant 82 depth. That is, it is important for p-n junction 88 resulting from Be implant 82 to be in the lower spacer region and enlarging spacer 62, by incorporating the first half period of lower mirror 58 in it, which gives more process tolerance. An upper spacer 66 is situated between active region 64 and upper mirror 68.

Figure 4:
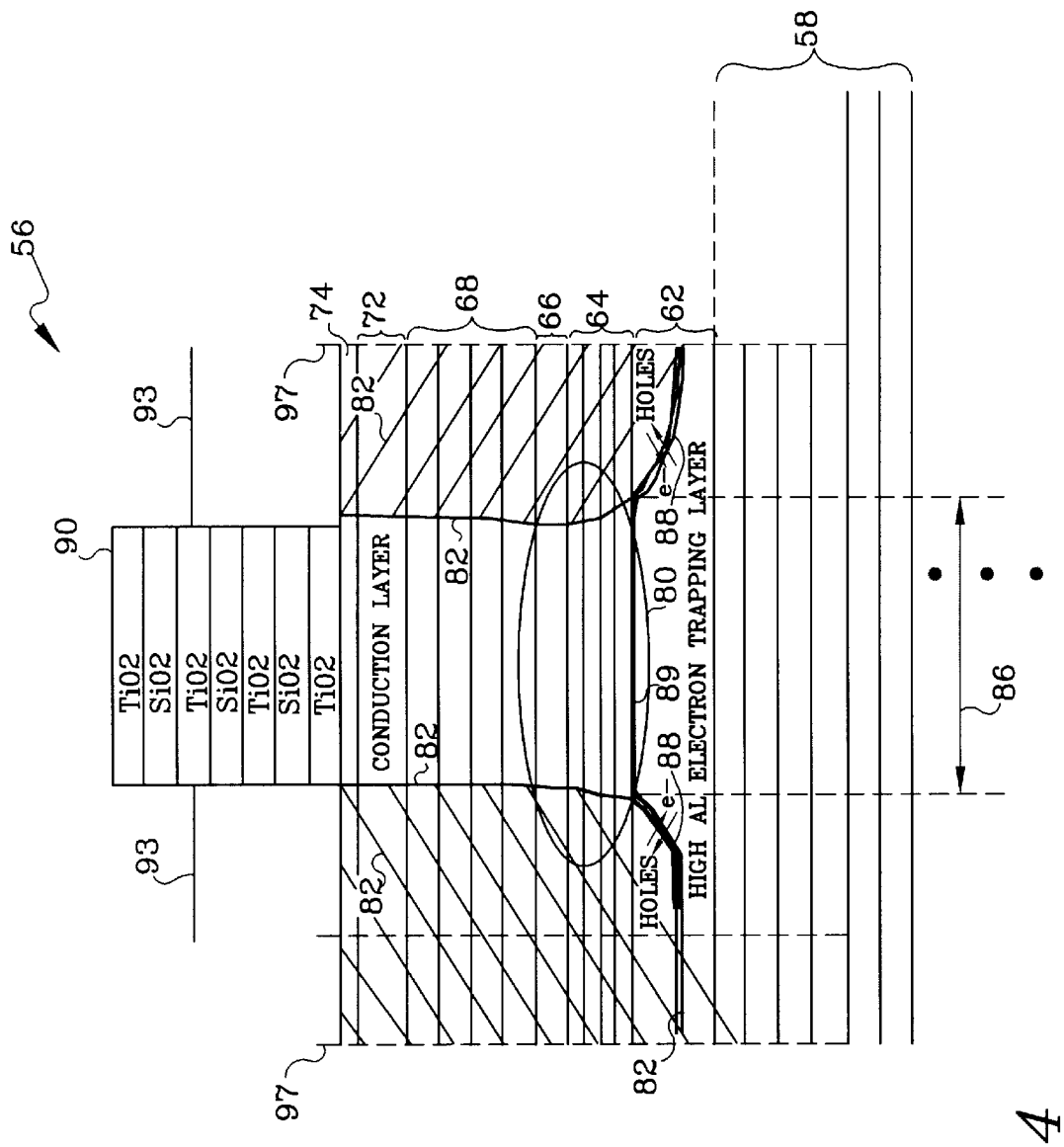
Figure 5:
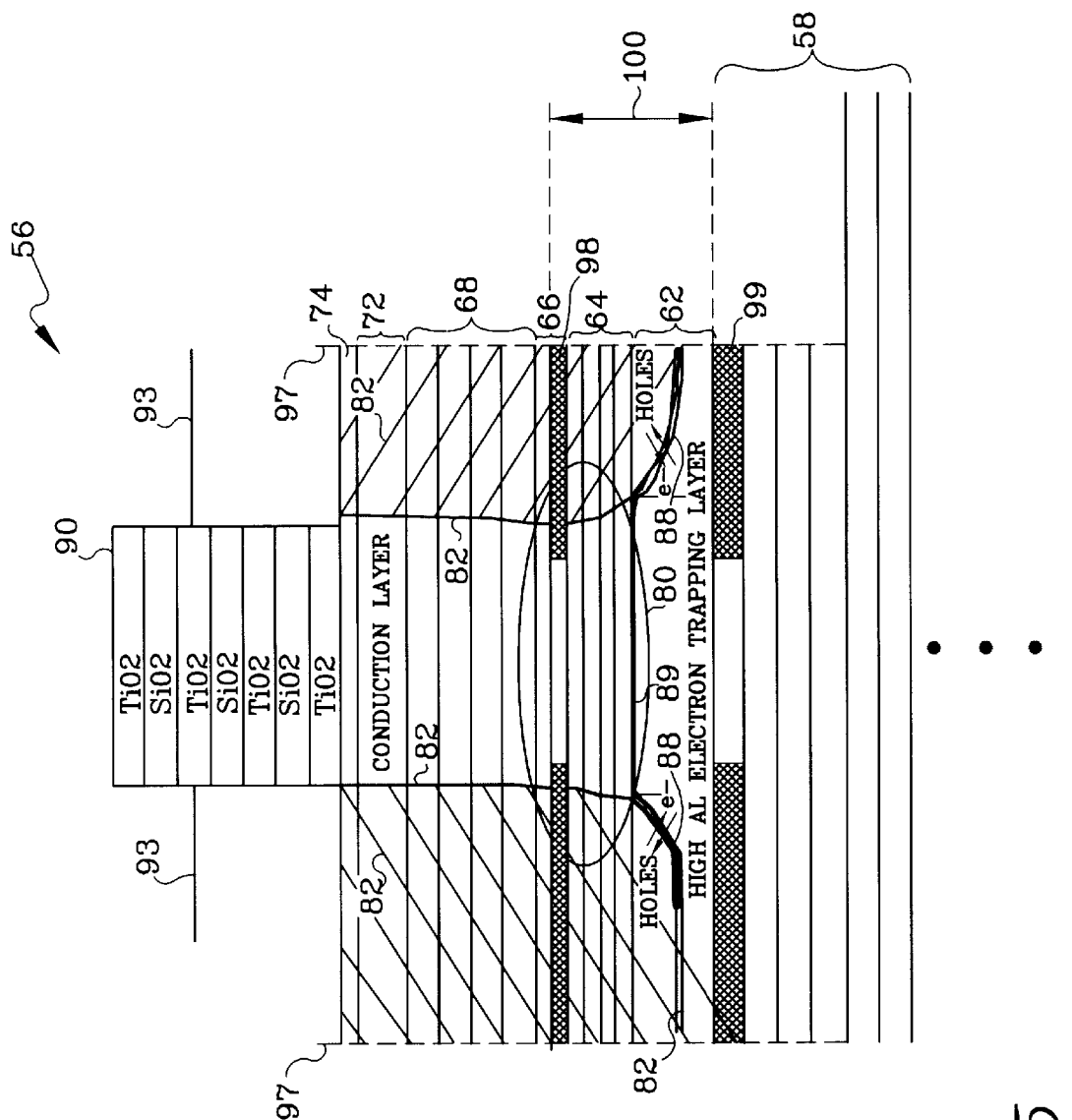

Etch 97 isolates the device in FIG. 4. With etch 97, an additional lateral etch or oxidation 98 or 99 can be used in FIG. 5. Lateral etches/oxidations 98 and 99 are alternative approaches for creating a lensing effect and laser mode control.

A feature of the invention is the placement of Be implant 82 resulting in a p-n junction 88 having a higher junction voltage in the wide gap material. The current is then confined to the center of active region 80 where the lack of Be implant 82 results in the p-n junction remaining in and having a lower junction voltage in narrow gap material. Thus for a given voltage applied across the junction which exceeds the lower junction voltage but is less than the higher junction voltage, results in a current flow across the p-n junction only in the narrow gap material, thereby resulting in current confined within the center of the structure and inside the periphery of Be implant 82. Implant 82 reduces the parasitic currents and provides an optical waveguide 86. Implant 82 is self-aligned with dielectric stack mirror 90 so that a continuous optical waveguide is achieved and guide 86 is self-aligned with active region 80 having the confined flow of current and the quantum wells within the inside perimeter of Be implant 82.

Figure 6:
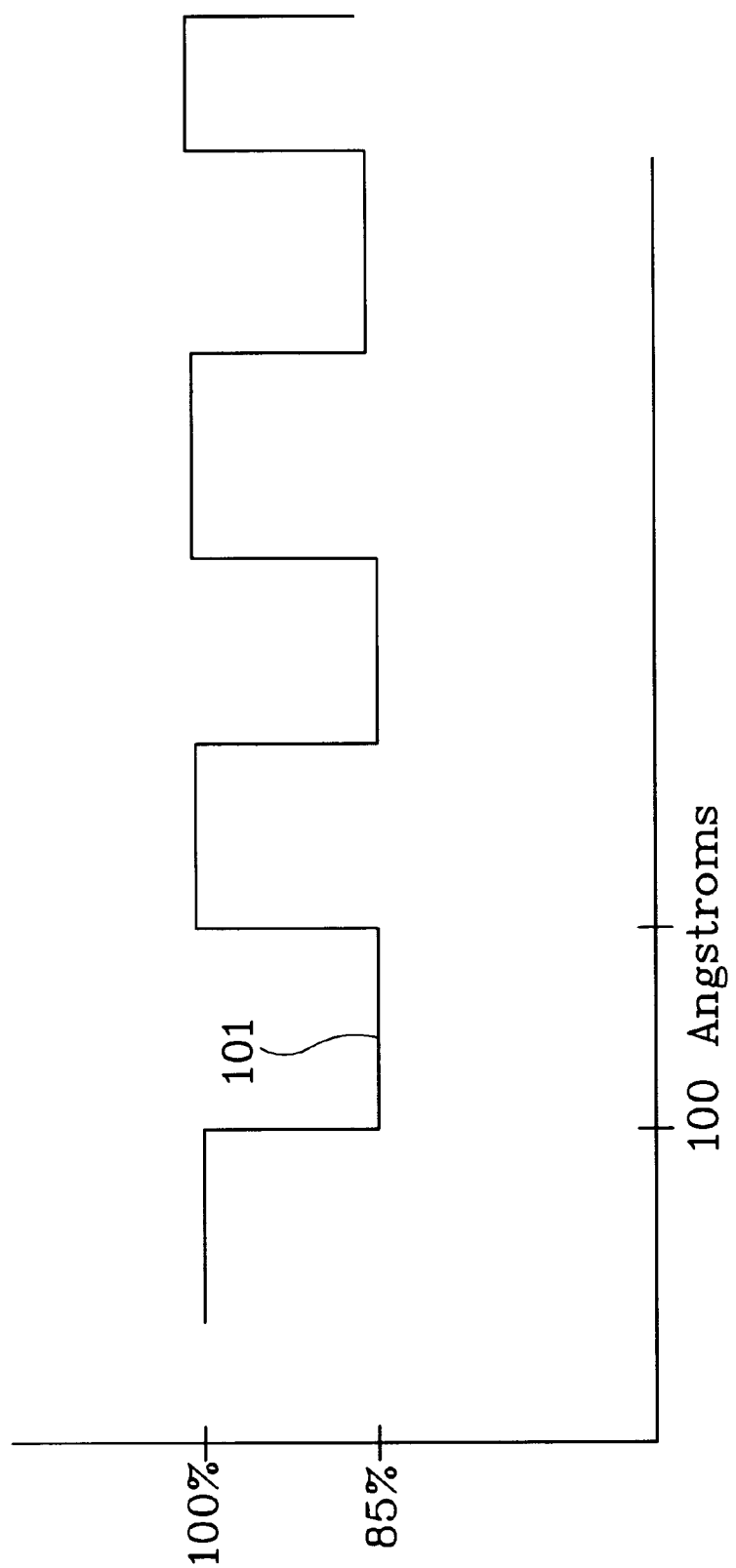
FIG. 6 reveals the structure of aluminum content in the electron trapping structure of a spacer region of a light emitting device.

Electron trapping structure of the lower spacer region 62 is achieved by varying the aluminum content in a series of wells 101 as shown in FIG. 6. In the present design, there are seven alterations of different aluminum contents to create such wells 101. Calculations show that 85 to 95 percent or a delta of 5 to 15 percent variation of aluminum content from AlAs is sufficient. One well may be likewise sufficient. The wells in the lower spacer are used to decrease the minority carrier diffusion length.

Figure 7:
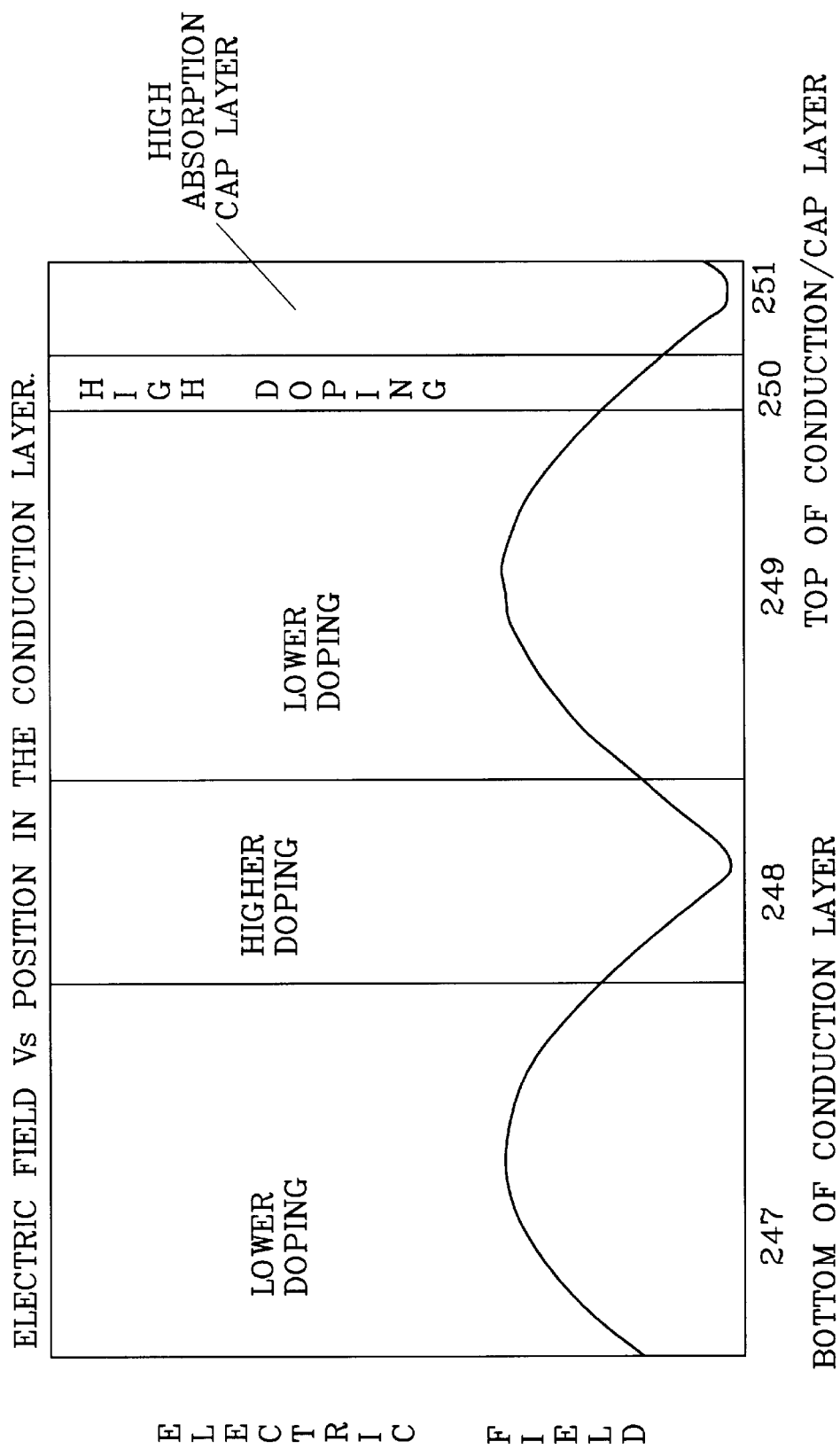
FIG. 7 illustrates the absolute value of the optical electric field in a conduction layer of a light emitting device.

Top semiconductor mirror 68 may be regarded as optional. It provides for added reliability. The maximum thickness of top mirror 68 is limited by how deep Be implant/diffusion 82 can go. This mirror also allows heavier doping in conduction layer 72 by reflecting most of the light before it gets to the high free carrier absorption of conduction layer 72. Cap layer 74 which is on top of the conduction layer 72 is pure GaAs with very heavy doping for electrical contact. FIG. 7 reveals the electric field versus position in conduction layer 72 and cap layer 74.

To make device 56, a lower n-mirror 58 along with an active region 64 and a reduced upper mirror 68 are grown. Reduced upper mirror 68 can end in a thin contact layer. Grown p-n junction 88 can be very near the quantum wells in wider gap material or even in the quantum well region 64. High contrast dielectric mirror 90 layers are deposited with a sacrificial layer 92 on top. Dielectric mirror stack 90 is patterned and used as a Be implant 82 mask. Resist is left on stack 90 for the implant if needed. The Be must go through active region 64 on into spacer 62, but stop significantly before the low gap material mirror 58 layers. Implant 82 does not reach the center of active region 80, because of the sacrificial layer 92 masking on dielectric stack 90. The etch of dielectric stack 90 may have a negative slope to enhance liftoff of layer 93.

Be implant 82 is annealed. This puts constraints on the sacrificial material 92 and the dielectrics of stack 90. The anneal removes implant damage, and/or diffuses the Be slightly, and/or disorders the material. Be is not the only dopant that can be used for implant 82.

One can pattern for a proton implant 76 for the metal runner and the bond pad, and pattern metal using liftoff by dissolving the sacrificial material and perhaps photoresist. Using the metal as a partial mask along with photoresist, one may perform a vertical RIE through the structure. This is an optional step for increased waveguiding. If desired, an undercut 98 or 99 can be performed either dry or with a wet etch and can be selective. That is, either the high or low content aluminum layers can be oxidized or etched selectively, or not, or some combination of the above.

Structure 56 eliminates parasitic currents because it is self-aligned electrically and optically, is small, has optical waveguiding and has high contrast mirrors. The inverse of this structure (n type in the top mirror 68 and active region 64, and p on bottom mirror 58) may be fabricated. The junction is where the p material ends and the n material begins, or vice versa.

The present device does not use debiasing to confine the current (i.e., no debiasing current). It is completely self-aligned in all the critical steps of fabrication. Also, this device does not rely on either a native oxide or a void etch to attain current confinement.

Figure 8:
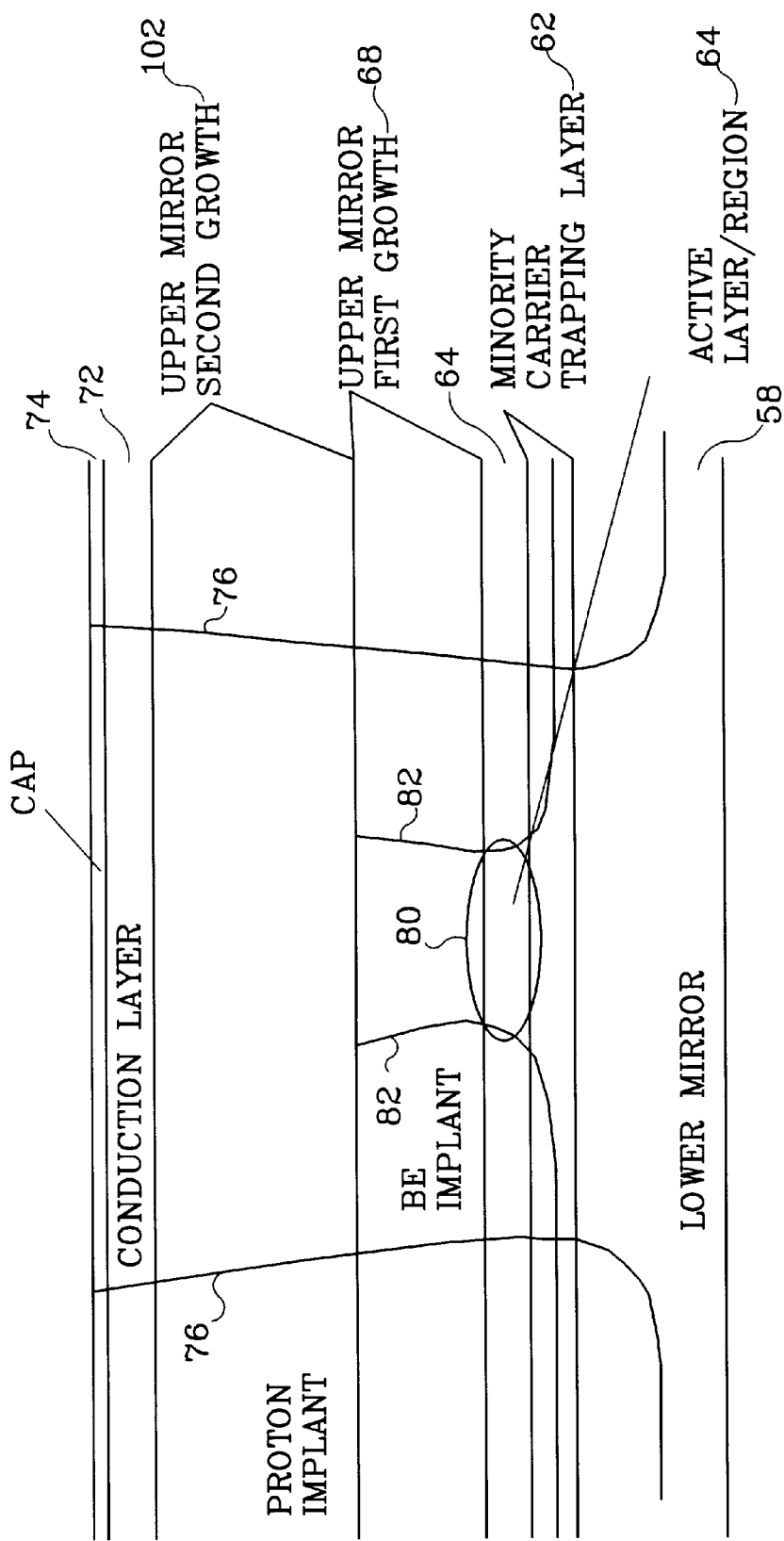
FIG. 8 shows another embodiment of the invention.

FIG. 8 reveals a bandgap isolated VCSEL with all semiconductor mirrors. Lower mirror 58 has a minority carrier trapping layer 62 formed on it. An active layer 64 is formed on trapping layer 62. An upper mirror first growth 68 is formed on active layer 64. A beryllium implant 82 is added to layers 68, 64 and part of layer 62, in the form of a donut or an enclosure around a central part conforming to a tube-like volume without implant 82. Active region 80 is situated in that volume. An upper mirror second growth 102 may be formed on first growth 68. Conduction layer 72 may be formed on second growth 102. A cap layer 74 may be formed on conduction layer 72. For device isolation, a proton implant 76 may be added forming a donut or tube-like volume without implant 76 that is larger than such volume formed by implant 82. This device may be constructed without layers 102, 72 and 74.

This invention may be incorporated in various embodiments, which are presented here by way of example. Configurations having any number of mirrors or no mirrors can incorporate the invention.

I claim:

1. A device comprising:
   a first region of material, having at least a portion of a first semiconductor type and having a first energy bandgap;
   a second region of material having a second energy bandgap, adjacent to said first region of material; and
   a first implant or diffusion of material of the first semiconductor type situated in a first portion of said second region; and
   wherein:
   a second portion of said second region of material is of the second semiconductor type;
   a first junction is of said first region of material of the first semiconductor type and the second portion of said first or second region of material of the second semiconductor type;
   a second junction is of said first implant or diffusion of material of the first semiconductor type in the first portion of said second region and the second portion of said second region of material of the second semiconductor type; and
   the second energy bandgap is wider than the first energy bandgap.

2. The device of claim 1 wherein:
   the first portion of said second region encircles the second portion of said second region;
   the forward voltage of the first junction is less than the forward voltage of the second junction; and
   if a voltage bias across said first and second regions is less than the forward voltage of the second junction and greater than the forward voltage of the first junction, then current flow coming through from said first region will result essentially in current confinement to the second portion of said second region.

3. The device of claim 2 further comprising a first reflective region adjacent to said second region.

4. The device of claim 3 further comprising a second reflective region adjacent to said first region.

5. The device of claim 4 further comprising a doping defined optical waveguide through said first and second regions.

6. The device of claim 5 further comprising a minority carrier trapping structure in said second region.

7. The device of claim 6 further comprising a conduction region adjacent to said second reflective region.

8. The device of claim 7 further comprising a third reflective region adjacent to said conduction region.

9. The device of claim 8 wherein said conduction region is stratified with higher doping at electric field minima of the device and lower doping at electric field maxima.

10. The device of claim 9 wherein said minority carrier trapping structure has wells to decrease minority carrier diffusion length.

11. The device of claim 10 further comprising a cap region situated between said conduction region and third reflective region.

12. The device of claim 11 wherein said third reflective region is a dielectric stack mirror.

13. The device of claim 12 wherein the top and bottom layers of the dielectric stack mirror has a higher index of the materials used in the stack mirror, to minimize absorption in said cap region.

14. The device of claim 13 wherein a minimum of the electric field associated with the doping of said conduction region, is also at said cap region.

15. The device of claim 14 wherein the current confinement and the optical waveguide are self-aligned with the dielectric stack mirror.

16. The device of claim 15 further comprising a metal contact region formed on said cap region.

17. The device of claim 16 wherein said metal contact region is self-aligned with the current confinement.

18. The device of claim 17 wherein the device is isolated with a second implant or diffusion encircling a portion of said first implant or diffusion.

19. The device of claim 17 wherein the device is isolated with an etch encircling a portion of said first implant or diffusion.

20. The device of claim 17 further comprising a lateral etch proximate to said first region of material for creating a lensing effect.

21. The device of claim 17 further comprising a lateral etch proximate to said second region of material for creating a lensing effect.

22. A device comprising:
a first region of a first dopant type and a first energy bandgap;
an active second region having at least one layer of a second dopant type and a second energy bandgap, formed on said first region;
a material of a second dopant type implanted or diffused in a first portion of said first region and of said active second region;
wherein:
a first junction is situated at a border of a second portion of said first region and of said active second region;
a second junction is situated at a border of the first portion and the second portion of said first region; and
the first energy bandgap is wider than the second energy bandgap.

23. The device of claim 22 further comprising a reflective third region formed on said first region.

24. The device of claim 23 further comprising a reflective fourth region formed on said active second region.

25. A device comprising:
an active gain region;
a wide energy bandgap region proximate to said active gain region; and
an implantation situated in a first portion of said active gain region and in a first portion of said wide energy bandgap region; and
wherein:
the first portion of said active gain region is of a first semiconductor type;
the first portion of said wide energy bandgap region is of a first semiconductor type;
the second portion of said active gain region is of the first semiconductor type;
the second portion of said wide energy bandgap region is of the second semiconductor type;
a junction is between the first and second semiconductor types;
a first turn-on voltage is characteristic of the junction situated at least adjacent to said active gain region; and
a second turn-on voltage is characteristic of the junction situated in said wide energy bandgap region.

26. The device of claim 25 wherein the second turn-on voltage is greater than the first turn-on voltage.

27. The device of claim 26 further comprising:
a first mirror of the first semiconductor type adjacent to said active gain region; and
a second mirror of the second semiconductor type adjacent to said wide energy bandgap region.

28. The device of claim 27 wherein the device may function with a voltage applied across the device that exceeds the first turn-on voltage and is less than the second turn-on voltage.

29. The device of claim 28 wherein upon functioning of the device, current flow in the device is confined mainly within the first portion of said active region.

30. The device of claim 29 further comprising a conduction region adjacent to said first mirror.

31. The device of claim 30 wherein:
the first semiconductor type is a P type material; and
the second semiconductor type is an N type material.

32. A device comprising:
a first mirror of a first semiconductor type;
a carrier trapping region of the first semiconductor type, formed on said first mirror;
an active gain region of a second semiconductor type formed on said carrier trapping region;
a second mirror of the second semiconductor type formed on said active gain region; and
an implantation of the second semiconductor type in a portion of said active gain region and of said carrier trapping region;
wherein:
an interface between the active gain region and the carrier trapping region is a the first junction of the first and second semiconductor types having a first turn-on voltage; and
an interface between said carrier trapping region and said implantation in said carrier trapping region is a second junction of the first and second semiconductor types having a second turn-on voltage.

33. The device of claim 32 wherein the second turn-on voltage exceeds the first turn-on voltage.

* * * * *